United States Statutory Invention Registration [19]

Yoder

[11] Reg. Number: H368

[43] Published: Nov. 3, 1987

[54] FIELD-EFFECT TRANSISTOR

[75] Inventor: Max N. Yoder, Falls Church, Va.

[73] Assignee: The United States of America as represented by the Secretary of the Navy, Washington, D.C.

[21] Appl. No.: 187,672

[22] Filed: Sep. 16, 1980

[51] Int. Cl.[4] ..... H01L 29/80; H01L 21/265

[52] U.S. Cl. ..... 357/22; 357/15; 357/63; 357/64; 148/DIG. 23; 148/DIG. 40; 148/DIG. 56; 148/DIG. 84

[58] Field of Search ..... 357/15, 22, 63, 64, 357/61

[56] References Cited

U.S. PATENT DOCUMENTS

| | | | |
|---|---|---|---|
| 3,804,681 | 4/1974 | Drangeid et al. | 357/22 |
| 3,997,908 | 12/1976 | Schloetterer et al. | 357/22 |
| 4,196,439 | 4/1980 | Niehaus et al. | 357/15 |
| 4,244,097 | 1/1981 | Cleary | 357/22 |

OTHER PUBLICATIONS

Rao et al, "Ion Implantation in Semiconductors", (Plenum Press, 1976, pp. 77–88.

Das et al, IEEE Trans. on Electron Devices, vol. ED24, No. 6, Jun. 1977, pp. 757–761.

Kung et al, Electronics Letters, vol. 13, No. 7, 31 Mar. 1977, pp. 187–188.

*Primary Examiner*—Stephen C. Buczinski
*Assistant Examiner*—Linda J. Wallace
*Attorney, Agent, or Firm*—Kenneth E. Walden; Frederick A. Wein; John G. Wynn

[57] ABSTRACT

A method of improving field-effect transistors, and the product thereof, wherein the resistivity of the upper layer of the source-gate channel region of a GaAs field-effect transistor (FET) may be selectively raised is disclosed. Impurity ions are implanted in the source-gate channel region followed by a much shallower implantation of boron in the same region. The boron ion concentration should exceed the N+ impurity ion concentration by a factor of 2 or more.

5 Claims, 3 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

IMPROVED ION-IMPLANTED FET

EPITAXIAL FET

ION-IMPLANTED FET

IMPROVED ION-IMPLANTED FET

FIELD-EFFECT TRANSISTOR

BACKGROUND OF THE INVENTION

This invention relates to an improved field-effect transistor (FET) and especially to improvement of FET's by tailoring the source-gate channel resistivity to be high in the upper layer and lower in the lower layer.

Transconductance, gate capacitance, source parasitics, and source-gate channel resistance are the factors universally known to affect the performance of field-effect transistors. Previous work in the field has done much to improve transconductance by improving materials' quality and materials' interfaces. Gate capacitance has been reduced by using submicrometer resolution lithography. Source parasitics have been greatly reduced by better metallization for ohmic contacts by "via" technology and by monolithic, Class B, push-pull circuit techniques. Only source-gate channel resistance has evaded a solution enabling it to be reduced without adversely affecting gate leakage characteristics.

SUMMARY OF THE INVENTION

Accordingly, it is an object of this invention to reduce the source-gate channel resistance in an FET without adversely affecting the gate leakage characteristic.

Another object is to raise the resistivity of a shallow layer of the source-gate channel in an FET, which layer is in contact with the Schottky-barrier portion of the gate, without increasing the resistivity of the remainder of the source-gate channel.

The above and other objects of the invention are accomplished in a GaAs FET by selectively bombarding the N+ doped source-gate channel region with boron ions to raise the resistivity of a shallow upper layer of the channel which is in contact with the Schottky-barrier film of the gate without increasing the resistivity of the underlying channel region. The technique makes use of the virtual non-existence of ionicity in the boron-arsenide bond to induce arsenic vacancies within the crystal which may, in part, be filled with column IV acceptors (e.g., silicon) with the result that deep-level compensating centers are formed (probably by silicon-silicon complexes) thereby transforming the material so treated into semi-insulating material.

DETAILED DESCRIPTION OF THE INVENTION

Figure 1:
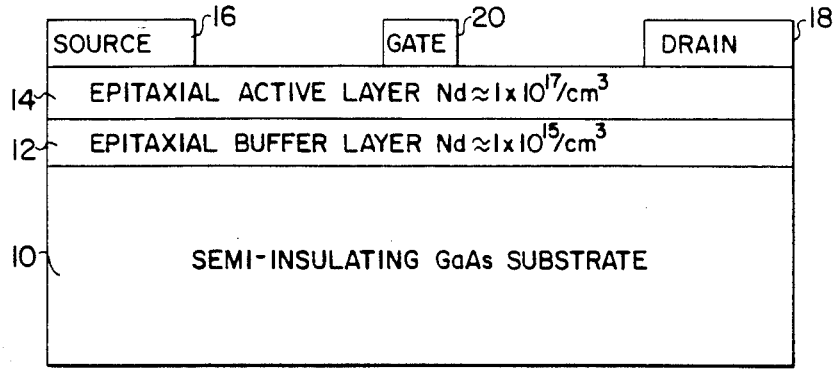
FIG. 1 (PRIOR ART)
FIG. 1 is a schematic illustration of a prior-art FET made by an epitaxial growth technique.
Figure 2:
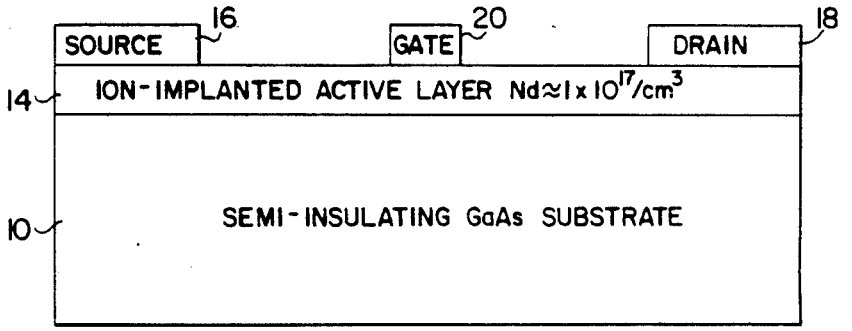
FIG. 2 (PRIOR ART)
FIG. 2. is a schematic illustration of a prior-art FET made by an ion implantation technique.

FIGS. 1 and 2 illustrate the construction of typical prior-art FET's. The FET of FIG. 1 is produced by the growth of epitaxial layers 12 and 14 on a semi-insulating GaAs substrate 10. Layer 14 has a higher concentration of donor impurity ions (approximatel $1\times10^{17}/cm^3$) than lower layer 12 and therefore has higher conductivity. The active layer 14 in FIG. 2 is produced by implantation of donor ions. The device also includes a source 16, a drain 18 and a gate 20. In both cases, the active channel, which may, for example, be about 0.5 microns deep, is uniformly doped in the horizontal direction (i.e., along the direction of charge-carrier movement).

Figure 3:
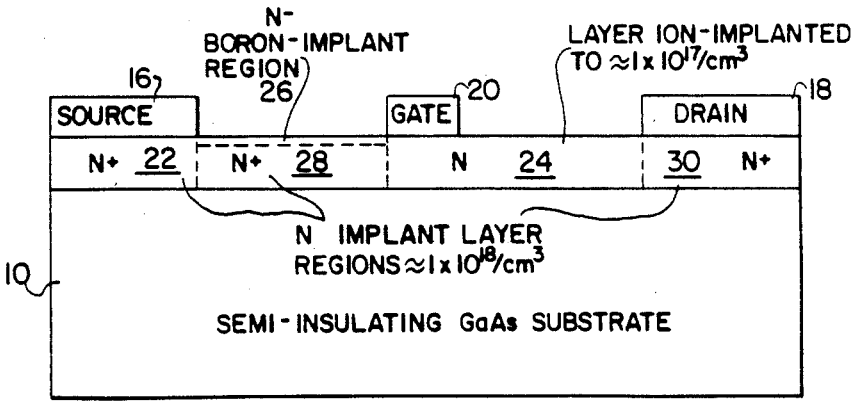
FIG. 3 is a schematic illustration of an embodiment of the present invention.

Referring now to FIG. 3, the source-gate channel region 28, including a top portion 26 and a bottom portion 26', between source 16 and gate 20 (Schottky barrier gate) should be of much lower resistivity than a region 24 lying beneath the gate 20 and between the gate 20 and the drain 18. If the source-gate channel region 28 is heavily doped, however, the leakage of the Schottky barrier gate 20 is excessive. Techniques to create a vertical gradient of resistivity in this region have thus far been unsuccessful since there has been no ion implantation technology capable of reproducibly creating such a gradient. The ideal characteristic is one in which the electrically active impurity concentration at the top portion 26 of the source-gate channel region 28 is less than or equal to that of the region 24 directly beneath the gate 20, while the electrically active impurity concentration in the lower portion 26' of the source-gate channel region 28 is at least an order of magnitude greater than the impurity concentration in the same region 24 directly beneath the gate 20. The achievement of such an impurity gradient profile virtually eliminates the source-gate channel resistance as a significant factor adversely affecting FET performance and the gradient does not adversely affect the characteristics of the Schottky-barrier gate 20.

To achieve this optimum gradient profile in the source-gate channel region 28 without adversely changing the impurity profile elsewhere requires a new approach based on an understanding of how impurity complexes can be used to reproducibly and reliably control the properties of semiconductors. The implantation of boron is known to render GaAs semi-insulating since it compensates, or neutralizes, other impurities which render the GaAs more conductive. Thus the effect of the boron is to render the doped GaAs more insulative. Only recently has it been found that the boron implant dose need not be excessive to the extent of rendering the semiconductor amorphous but, instead, need only exceed the concentration of other impurities within the GaAs. More recently, it has been shown that boron implanted in GaAs does not diffuse within the GaAs at elevated temperatures as do most other impurities.

Still referring to FIG. 3, to the optimum gradient profile in the source-gate channel region 28 of the improved ion-implanted FET shown, an impurity ion is selected (e.g., Si, or Si and S) and selectively implanted into the source-gate channel region 28. This may be done simultaneously with the N+ selective source and drain implants in regions 22 and 30, respectively. (In this context, the term "selectively" applies to the particular region selected for any ion implantation.) As shown, the region 24 is implanted only to the N state, or a concentration of about $1\times10^{17}/cm^3$. However, the other regions 22, 28 and 30, as aforementioned, are implanted to the N+ state, or a concentration of about $1\times10^{18}/cm^3$. These implants are then followed by a much shallower (i.e., done with a lower implantation voltage) implant (e.g., 200–500 Å) of boron into the top portion 26 of source-gate channel region 28. By so doing, As vacancies are created in the top portion 26 but not in the bottom portion 26' of the source-gate channel region 28. The concentration of the boron implant should exceed the concentration of the N+ impurity by a factor of 2 or more to ensure that some As vacancies remain in the top portion 26 after other As vacancies are filled by the acceptor (silican) ions previously implanted. The maximum concentration of boron should be below that which would cause the GaAs to become amorphous; thus, the concentration should not be more than about $5\times10^{19}/cm^3$.

Activation/annealing of the implanted ions may then proceed in a conventional manner chosen by the fabricator (i.e., thermal, laser and/or electron beam). The annealing ambient must be chosen so that the boron-implanted region, i.e., top portion 26, is not etched away in the process (e.g., use flowing arsine, proximity capping or a good silicon nitride encapsulant).

Obviously, many modifications and variations of the present invention are possible in light of the above teachings. It is therefore to be understood that, within the scope of the appended claims, the invention can be practiced otherwise than as specifically described.

What is claimed is:

1. An improved field-effect transistor of the type having a semi-insulating GsAs substrate, an active layer ion implanted into said semi-insulating GaAs substrate, a source fashioned on one end of said semi-insulating GaAs substrate, a drain fashioned on the other end thereof and a Schottky barrier gate fashioned therebetween, said source, said drain and said Schottky barrier gate being fashioned contiguous to the top of said active layer so as to define a first active region underlying said source, a second active region lying between said source and said Schottky barrier gate, a third active region having a portion underlying said Schottky barrier gate and a portion lying between said Schottky barrier gate and said drain, and a fourth active region underlying said drain, wherein the improvement comprises:

selectively implanting said semi-insulating GaAs substrate with impurity ions to the N+ state to form said first, second and fourth active regions, and implanting said semi-insulating GaAs substrate with said impurity ions to the N state to form said third active region; and selectively implanting a top portion of said second active region to a predetermined depth with a predetermined concentration of boron ions so as to raise the resistivity of said top portion thereof, said top portion extending from said source to said Schottky barrier gate.

2. The improved field-effect transistor of claim 1 wherein the N state corresponds to a concentration of approximately $1\times10^{17}/cm^3$ and the N+ state corresponds to a concentration of approximately $1\times10^{18}/cm^3$.

3. The improved field-effect transistor of claim 2 wherein the predetermined concentration of boron ions is at least two times the concentration of the N+ state but less than that which cause said top portion of said second active region to become amorphous.

4. The improved field-effect transistor of claim 3 wherein the predetermined depth of said top portion is in the range of 200–500 Å.

5. The improved field-effect transistor of claim 4 wherein said impurity ions are selected from the group consisting of Si and a mixture of Si and S.

* * * * *